United States Patent
Neuendorffer et al.

(10) Patent No.: US 9,081,930 B1
(45) Date of Patent: Jul. 14, 2015

(54) THROUGHPUT DURING HIGH LEVEL SYNTHESIS

(71) Applicant: Xilinx, Inc., San Jose, CA (US)

(72) Inventors: Stephen A. Neuendorffer, San Jose, CA (US); Kecheng Hao, San Jose, CA (US); Guoling Han, Fremont, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/450,544

(22) Filed: Aug. 4, 2014

(51) Int. Cl.
  *G06F 17/50* (2006.01)
  *G06F 11/26* (2006.01)

(52) U.S. Cl.
  CPC ............ *G06F 17/505* (2013.01); *G06F 11/261* (2013.01); *G06F 17/5045* (2013.01)

(58) Field of Classification Search
  CPC .. G06F 17/505; G06F 17/5045; G06F 11/261
  See application file for complete search history.

(56) References Cited

U.S. PATENT DOCUMENTS

| | | | | |
|---|---|---|---|---|
| 5,488,730 A * | 1/1996 | Brown et al. | | 712/41 |
| 5,860,018 A * | 1/1999 | Panwar | | 712/23 |
| 6,263,302 B1 * | 7/2001 | Hellestrand et al. | | 703/17 |
| 6,279,100 B1 * | 8/2001 | Tremblay et al. | | 712/24 |
| 7,222,314 B1 * | 5/2007 | Miller et al. | | 716/103 |
| 7,509,619 B1 * | 3/2009 | Miller et al. | | 716/102 |
| 7,779,238 B2 * | 8/2010 | Kosche et al. | | 712/227 |
| 7,869,452 B1 * | 1/2011 | Neuendorffer | | 370/414 |
| 7,953,960 B2 * | 5/2011 | Feiste et al. | | 712/216 |
| 8,116,334 B1 * | 2/2012 | Neuendorffer | | 370/414 |
| 8,122,239 B1 * | 2/2012 | James-Roxby et al. | | 713/100 |
| 8,448,150 B2 * | 5/2013 | Kim et al. | | 717/136 |

* cited by examiner

*Primary Examiner* — Naum B Levin
(74) *Attorney, Agent, or Firm* — Kevin T. Cuenot

(57) ABSTRACT

Improving throughput during high level synthesis includes determining a data dependency for a flow control construct of a high level programming language description and translating the high level programming language description into a circuit design specifying circuitry for implementation within an integrated circuit. The circuitry is pipelined. As part of the circuit design and using a processor, a stall detection circuit is generated. The stall detection circuit is coupled to selectively initiate a stall of a stalling portion of the circuitry according to the data dependency.

19 Claims, 6 Drawing Sheets

```
300        F(x) {
              For (I = 1 to 100) {
                 A[I] = A[X] + 1;
              }
           }
```

```
400        F() {
              For (J = 1 to 100) {
                 For (I = 1 to 100) {
                    A[I][J] = g(A[J,J], A[I][J]);
                 }
              }
           }
```

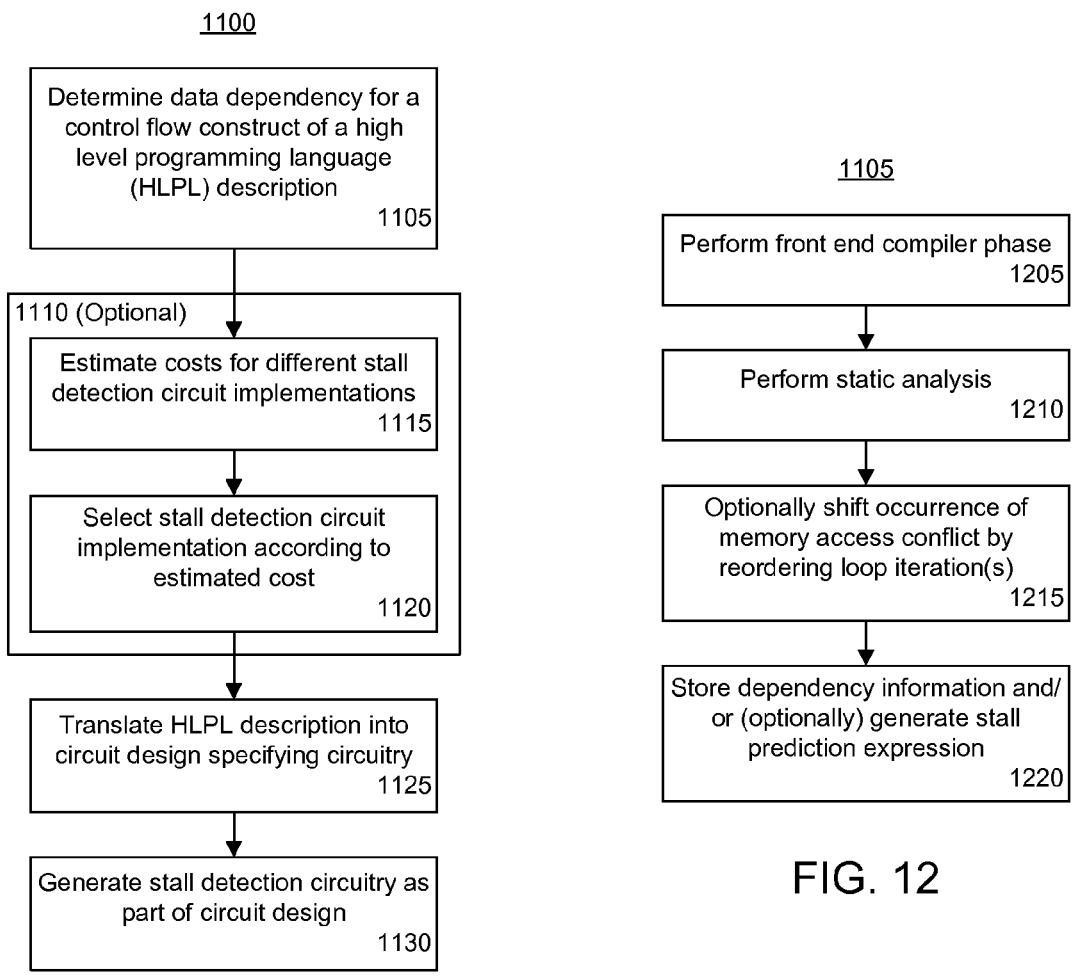

THROUGHPUT DURING HIGH LEVEL SYNTHESIS

FIELD OF THE INVENTION

This disclosure relates integrated circuits (ICs) and, more particularly, to improving throughput of a circuit design during high level synthesis.

BACKGROUND

High-level synthesis (HLS) is an automated design process that creates a circuit design from a high level programming language description of an electronic system. The high level programming language description of the electronic system is an algorithmic description. Examples of high level programming languages include, but are not limited to, C, C++, SystemC, and the like. During HLS, an electronic design automation (EDA) tool operates on the high level programming language description and generates a circuit design. The EDA tool translates the high level programming language description into the circuit design. The circuit design is a hardware description of the electronic system. The circuit design may be a register-transfer level description of the electronic system specified using a hardware description language (HDL).

During HLS, programming language constructs such as functions and/or loops may be analyzed in an effort to generate pipelined circuitry for the body of the construct. Generating pipelined circuitry, however, is dependent upon avoiding read and/or write conflicts to memories in the resulting circuitry. Typically, conflicts are detected through the use of static code analysis as may be performed by a compiler operating on the high level programming language description.

Performing HLS based upon static code analysis tends to be overly conservative. One reason is that static code analysis treats each iteration of a construct such as a loop or execution of a function the same as each other iteration. In generating the circuit design, throughput is reduced until any potential conflicts are avoided in all cases. In effect, the worst case scenario for the occurrence of memory access conflicts, as determined by static analysis, tends to determine throughput of the circuitry specified by the circuit design.

SUMMARY

A method includes determining a data dependency for a flow control construct of a high level programming language (HLPL) description and translating the HLPL description into a circuit design specifying circuitry for implementation within an integrated circuit. The circuitry is pipelined. The method also includes generating, as part of the circuit design and using a processor, a stall detection circuit coupled to selectively initiate a stall of a stalling portion of the circuitry according to the data dependency.

A system includes a first memory, a stalling circuit coupled to the first memory, and a flushing circuit coupled to the first memory. The system includes a stall detection circuit coupled to detect a memory access conflict between the stalling circuit and the flushing circuit according to a data dependency. The system also includes a pipeline control circuit coupled to stall the stalling circuit responsive to detection of the memory access conflict by the stall detection circuit.

A stall detection circuit includes a first memory coupled to receive an address for a memory access of a stalling portion of a circuit, a second memory coupled to store addresses of uncompleted memory accesses received from a flushing portion of the circuit, and a comparison circuit coupled to determine whether the address in the first memory matches addresses stored in the second memory. Responsive to determining a match, the comparison circuit is coupled to generate a conflict signal to a pipeline control circuit coupled to control stalling of the stalling portion of the circuit.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description with reference to the drawings.

FIGS. 5-1 and 5-2 are block diagrams illustrating exemplary circuitry generated from the HLPL description of FIG. 3.

FIG. 11 is a flow chart illustrating an exemplary method of high level synthesis.

FIG. 12 is a flow chart illustrating an exemplary implementation of block 1105 of FIG. 11.

DETAILED DESCRIPTION

Figures 1, 3, 4:
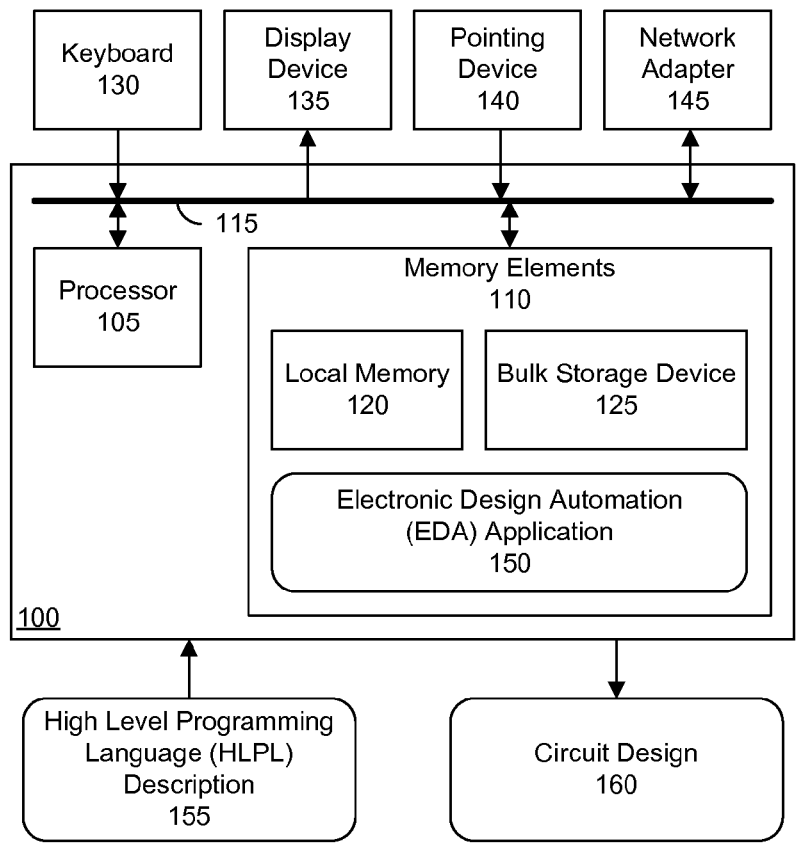
FIG. 1 is a block diagram illustrating an exemplary data processing system.
FIG. 3 is an exemplary high level programming language (HLPL) description.
FIG. 4 is another exemplary HLPL description.

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to integrated circuits (ICs) and, more particularly, to improving throughput of a circuit design during high level synthesis (HLS). In accordance with the inventive arrangements disclosed herein, one or more constructs of a high level programming language (HLPL)

description are analyzed. Data dependencies that may result in a memory access conflict in the resulting circuit design may be identified.

The HLPL description is translated into a circuit design through an HLS process. The circuitry specified by the resulting circuit design may include a pipelined circuit implementation for the construct(s) of the HLPL description. The generated circuitry may be aggressively pipelined by including stall detection circuitry that is aware of the data dependencies determined from the construct.

The stall detection circuitry is coupled to detect the occurrence of a memory access conflict that is data dependent using the information from the analysis of the construct. Responsive to detecting a memory access conflict, the stall detection circuitry may assert a conflict signal to another control circuit responsible for stalling one or more portions of the circuitry. Memory access conflicts may be detected with greater precision thereby allowing the construct of the HLPL description to be pipelined in an aggressive manner as if memory access conflicts do not occur. The memory access conflicts may be addressed at the time that the memory access conflict arises by the stall detection circuit during operation. As such, the amount of pipelining introduced into the circuitry need not be reduced.

The inventive arrangements described herein may be implemented as a method or process performed by a data processing system. The inventive arrangements described herein further may be implemented as a system including a plurality of circuits that operate cooperatively with one another. The inventive arrangements further may be implemented as circuitry and, more particular, as a stall detection circuit.

In other aspects, the inventive arrangements may be implemented as a data processing system having a processor. The processor, upon executing program code, performs an HLS process upon an HLPL description to generate a circuit design. The inventive arrangements may be implemented as a non-transitory computer-readable storage medium storing program code that, when executed, causes a processor and/or a system to perform and/or initiate a method or process as described herein.

As defined herein, the term "high level programming language" or "HLPL" means a set of instructions or statements used to describe an electronic system where the instructions typically have a strong abstraction from the details of the described electronic system. An HLPL may hide aspects of operation of the described electronic system such as memory management or machine instructions and may enable a program, written in the HLPL, to be transformed into a variety of systems. When using an HLPL, the user may, but need not, explicitly describe the registers, memory addresses, machine instructions, etc. of the electronic system to be generated from the HLPL description or program. Examples of HLPLs include, but are not limited to, C, C++, SystemC, or the like. In some cases, the instruction set of a particular data processing system may be considered an HLPL when transformed into a program expressed in the instruction set of an alternate, or different, data processing system.

As defined herein, the term "control flow construct" means one or more statements or instructions of a high level programming language (HLPL) whose execution results in a choice being made as to which of two or more different execution paths are followed. An example of a control flow construct is a conditional branch. A conditional branch refers to the case where statements are executed only when a condition is met or the case where statements are executed until a condition is met. Conditional branches include loops, for next, if-then, and if-then-else high level programming language structures or constructs.

As defined herein, the term "hardware description language" or "HDL" is a computer-language that facilitates the documentation, design, and implementation of a digital system. The implementation of the digital system may include the transformation of the digital system into a set of masks for IC manufacturing, the programming of a programmable IC such as a field programmable gate array (FPGA), or the like. Using an HDL, for example, a user can design and specify an electronic circuit, describe the operation of the circuit, and create tests to verify operation of the circuit.

An HDL includes standard, text-based expressions of the spatial and temporal structure and behavior of the digital system being modeled. HDL syntax and semantics include explicit notations for expressing concurrent operations in a digital system and synchronizing the progress of concurrent operations to achieve a particular combined behavior. In many circuits, this synchronization is based on a globally visible signal called a "clock." It should be appreciated, however, that other mechanisms for synchronization between portions of a circuit may be provided.

As defined herein, the term "circuit design" means a description of a circuit. A circuit design may be a behavioural description such as a register-transfer-level description specified in an HDL, a hardware description specified as a netlist, a configuration bitstream, or the like. A circuit design is not an HLPL description.

For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

FIG. 1 is a block diagram illustrating an exemplary data processing system (system) 100. System 100 includes at least one processor, e.g., a central processing unit (CPU), 105 coupled to memory elements 110 through a system bus 115 or other suitable circuitry. System 100 stores program code within memory elements 110. Processor 105 executes the program code accessed from memory elements 110 via system bus 115. In one aspect, system 100 is implemented as a computer or other data processing system that is suitable for storing and/or executing program code. It should be appreciated, however, that system 100 may be implemented in the form of any system including a processor and memory that is capable of performing the functions described within this disclosure.

Memory elements 110 include one or more physical memory devices such as, for example, a local memory 120 and one or more bulk storage devices 125. Local memory 120 may be implemented as random access memory (RAM) or other non-persistent memory device(s) generally used during actual execution of the program code. Bulk storage device 125 may be implemented as a hard disk drive (HDD), solid state drive (SSD), or other persistent data storage device. System 100 may also include one or more cache memories (not shown) that provide temporary storage of at least some program code in order to reduce the number of times program code must be retrieved from the bulk storage device during execution.

Input/output (I/O) devices such as a keyboard 130, a display device 135, and a pointing device 140 optionally may be coupled to system 100. The I/O devices may be coupled to system 100 either directly or through intervening I/O controllers. A network adapter 145 may also be coupled to system 100 to enable system 100 to become coupled to other systems, computer systems, remote printers, and/or remote storage devices through intervening private or public networks. Modems, cable modems, Ethernet cards, and wireless transceivers are examples of different types of network adapter 145 that may be used with system 100.

As pictured in FIG. 1, memory elements 110 store an electronic design automation (EDA) application 150. EDA application 150, being implemented in the form of executable program code, is executed by system 100. As such, EDA application 150 is considered part of system 100. System 100, while executing EDA application 150, receives and operates upon an HLPL description 155. System 100 operates upon HLPL description 155 by performing one or more HLS operations. System 100 generates circuit design 160 from HLPL description 155. System 100 may store circuit design 160 or output circuit design 160 to another system.

EDA application 150, HLPL description 155, circuit design 160, and any data items used, generated, and/or operated upon by system 100 are functional data structures. As defined herein, a "functional data structure" imparts functionality when employed as part of system 100 or when such elements, including derivations thereof, are loaded into an IC such as a programmable IC.

Figure 2:
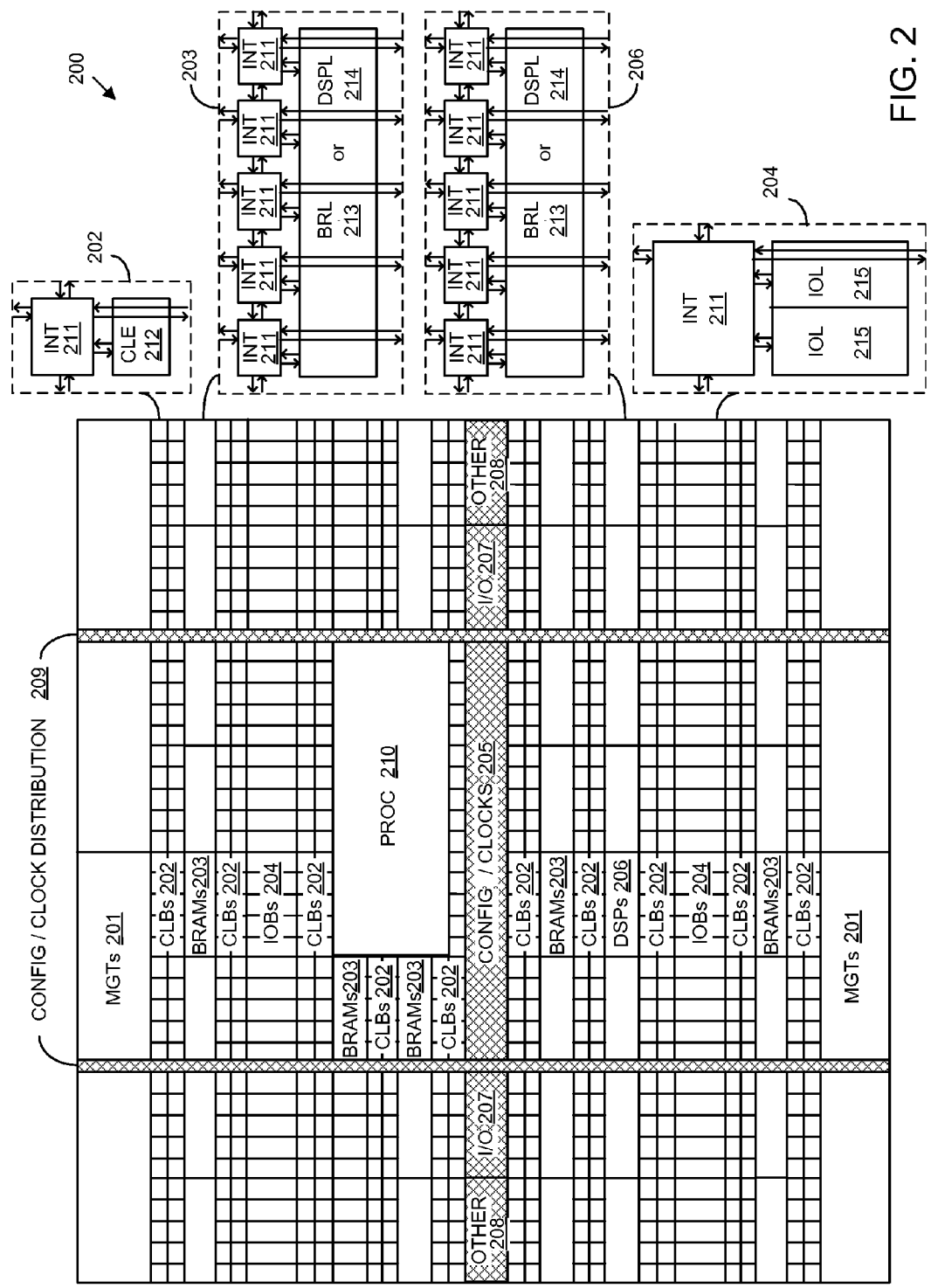
FIG. 2 is a block diagram illustrating an exemplary architecture for an integrated circuit.

FIG. 2 is a block diagram illustrating an exemplary architecture 200 for an IC. An IC using architecture 200 may be used to implement circuitry specified by circuit design 160, or a derivation thereof, for example. In one aspect, architecture 200 is implemented within a field programmable gate array (FPGA) type of IC. Architecture 200 is also representative of an SOC type of IC. An SOC is an IC that includes a processor that executes program code and one or more other circuits and/or circuit systems. The circuits and/or circuit systems may operate cooperatively with one another and with the processor.

As shown, architecture 200 includes several different types of programmable circuit, e.g., logic, blocks. For example, architecture 200 may include a large number of different programmable tiles including multi-gigabit transceivers (MGTs) 201, configurable logic blocks (CLBs) 202, random access memory blocks (BRAMs) 203, input/output blocks (IOBs) 204, configuration and clocking logic (CONFIG/CLOCKS) 205, digital signal processing blocks (DSPs) 206, specialized I/O blocks 207 (e.g., configuration ports and clock ports), and other programmable logic 208 such as digital clock managers, analog-to-digital converters, system monitoring logic, and so forth.

In some ICs, each programmable tile includes a programmable interconnect element (INT) 211 having standardized connections to and from a corresponding INT 211 in each adjacent tile. Therefore, INTs 211, taken together, implement the programmable interconnect structure for the illustrated IC. Each INT 211 also includes the connections to and from the programmable logic element within the same tile, as shown by the examples included at the top of FIG. 2.

For example, a CLB 202 can include a configurable logic element (CLE) 212 that may be programmed to implement user logic plus a single INT 211. A BRAM 203 may include a BRAM logic element (BRL) 213 in addition to one or more INTs 211. Typically, the number of INTs 211 included in a tile depends on the height of the tile. As pictured, a BRAM tile has the same height as five CLBs, but other numbers (e.g., four) may also be used. A DSP tile 206 may include a DSP logic element (DSPL) 214 in addition to an appropriate number of INTs 211. An IOB 204 may include, for example, two instances of an I/O logic element (IOL) 215 in addition to one instance of an INT 211. As will be clear to those of skill in the art, the actual I/O pads connected, for example, to IOL 215 typically are not confined to the area of IOL 215.

In the example pictured in FIG. 2, a columnar area near the center of the die, e.g., formed of regions 205, 207, and 208, may be used for configuration, clock, and other control logic. Horizontal areas 209 extending from this column are used to distribute the clocks and configuration signals across the breadth of the programmable IC.

Some ICs utilizing the architecture illustrated in FIG. 2 include additional logic blocks that disrupt the regular columnar structure making up a large part of the IC. The additional logic blocks may be programmable blocks and/or dedicated circuitry. For example, a processor block depicted as PROC 210 spans several columns of CLBs and BRAMs.

In one aspect, PROC 210 is implemented as a dedicated circuitry, e.g., as a hard-wired processor, that is fabricated as part of the die that implements the programmable circuitry of the IC. PROC 210 may represent any of a variety of different processor types and/or systems ranging in complexity from an individual processor, e.g., a single core capable of executing program code, to an entire processor system having one or more cores, modules, co-processors, interfaces, or the like.

In another aspect, PROC 210 is omitted from architecture 200 and replaced with one or more of the other varieties of the programmable blocks described. Further, such blocks may be utilized to form a "soft processor" in that the various blocks of programmable circuitry may be used to form a processor that executes program code as is the case with PROC 210.

The phrase "programmable circuitry" means programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, portions shown in FIG. 2 that are external to PROC 210 such as CLBs 202 and BRAMs 203 are considered programmable circuitry of the IC. Programmable circuitry may be configured or programmed to implement different physical circuits therein.

In general, the functionality of programmable circuitry is not established until configuration data is loaded into the IC. A set of configuration bits may be used to program programmable circuitry of an IC such as an FPGA. The configuration bit(s) are typically referred to as a "configuration bitstream." In general, programmable circuitry is not operational or functional without first loading a configuration bitstream into the IC. The configuration bitstream effectively implements or instantiates a particular physical circuit within the programmable circuitry. The configuration bitstream or circuit design specifies, for example, functional aspects of the programmable circuit blocks and physical connectivity among the various programmable circuit blocks that is otherwise non-existent.

Circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry has dedicated circuit blocks and interconnects, for example, that are functional without first loading a configuration bitstream into the IC. An example of hardwired circuitry is PROC 210.

In some instances, hardwired circuitry may have one or more operational modes that can be set or selected according to register settings or values stored in one or more memory elements within the IC. The operational modes may be set, for example, through the loading of a configuration bitstream into the IC. Despite this ability, hardwired circuitry is not considered programmable circuitry as the hardwired circuitry is operable and has a particular function when manufactured as part of the IC.

FIG. 2 is intended to illustrate an exemplary architecture that can be used to implement an IC that includes programmable circuitry, e.g., a programmable fabric. For example, the number of logic blocks in a column, the relative width of the columns, the number and order of columns, the types of logic blocks included in the columns, the relative sizes of the logic blocks, and the interconnect/logic implementations included at the top of FIG. 2 are purely exemplary. In an actual IC, for example, more than one adjacent column of CLBs may be included wherever the CLBs appear, to facilitate the efficient implementation of a user circuit design. The number of adjacent CLB columns, however, may vary with the overall size of the IC. Further, the size and/or positioning of blocks such as PROC 210 within the IC are for purposes of illustration only and are not intended as limitations.

FIG. 3 is an exemplary HLPL description 300. HLPL description 300 is an exemplary implementation of HLPL description 155 of FIG. 1. As illustrated, HLPL description 155 includes a function called "F(x)." Within the function is a control flow construct. The control flow construct is a "for loop." In implementing HLPL description 155 as a circuit design, memory access conflicts may occur during particular iterations of the loop. For example, if "A" is an array that is implemented as a memory, whether a two port memory or a single port memory, a memory access conflict may occur between read(s) and write(s) to the memory based upon the value of "I" and the value of "X." Thus, the iterations of the "for loop" in which a memory access conflict may occur are data dependent.

Data dependency for a memory access conflict means that occurrence of a memory access conflict is dependent upon one or more of values of control variables of the control flow construct and/or one or more of values of input variables to the control flow construct. In the example of FIG. 3, the control variable is "I" and the input variable is "X." In general, the control variable is defined within the control flow construct while an input variable is provided to the control flow construct, e.g., defined outside of the control flow construct and provided thereto.

In one aspect, EDA application 155 of FIG. 1 includes a compiler module. The compiler module is coupled to perform analysis, including static analysis, upon HLPL 300. In performing static analysis, the compiler module determines whether data dependencies exist. One example of a data dependency is loop dependence. EDA application 155 may determine whether statements in the body of a loop have a dependence. If a statement S2 depends on a statement S1, then statement S1 must be executed before statement S2.

Static analysis performed at compile-time is well-known and used for purposes such as parallel compilation. Static analysis may be used to analyze dependencies for regular array accesses such as where the array index is an affine function of the loop induction variables. A loop induction variable is a variable that is increased or decreased by a fixed amount during each iteration of a loop or a variable that is a linear function of another loop induction variable. In more complicated cases, dependency information may depend on the values determined within the program code at runtime. In those cases, static analysis may not analyze dependency accurately and, as such, provides overly conservative results by presuming that unresolved cases or indeterminate results for iterations are conflicts.

Referring to FIG. 3, "X" is a loop invariant variable. If the value of "X" is larger than 100, there is no dependency for the array accesses. If, however, the value of "X" is between 1 and 100, one or more loop iterations have dependency while other loop iterations do not have dependency. More particularly, the updates of A[I] where I<X do not depend on anything. The updates of A[I] wherein I>X must wait until the update of A[X] finishes. So the dependency only occurs when I>X.

Consider the case where an array read requires 2 clock cycles to complete, an addition requires 1 clock cycle to complete, and an array store (or write) requires 1 clock cycle to complete. The compiler, after analyzing HLPL description 300, may determine a stall prediction expression such as "if (I==X), then stall 4 clock cycles." By implementing the stall prediction expression within a stall detection circuit, all loop iterations may be fully pipelined without any loss in performance except for the iteration "X," i.e., where "I=X."

FIG. 4 is another exemplary HLPL description. HLPL description 400 may be an exemplary implementation of HLPL description 155 of FIG. 2. HLPL description 400 illustrates a more complex example than the example of FIG. 3. HLPL description 400 includes nested control flow constructs. More particularly, HLPL description 400 includes a function with nested "for loops." The first loop iterates on the loop control variable "J" from 1 to 100. The second, or inner, loop iterates on the loop control variable "I" from 1 to 100.

Within FIG. 4, the memory access conflicts are data dependent and depend upon the values of "I" and "J." Because both "I" and "J" are control variables, the value of each variable for each iteration is known. A compiler may determine the particular iterations of each "for loop" during which a memory access conflict occurs, e.g., by stepping through the iterations. Moreover, the compiler may determine a stall prediction expression that may be output in an HDL format for purposes of implementation as circuitry within an IC. The stall prediction expression, specified in HDL for example, may be incorporated into a stall detection circuit included within the resulting circuit design.

Figures 1, 5:
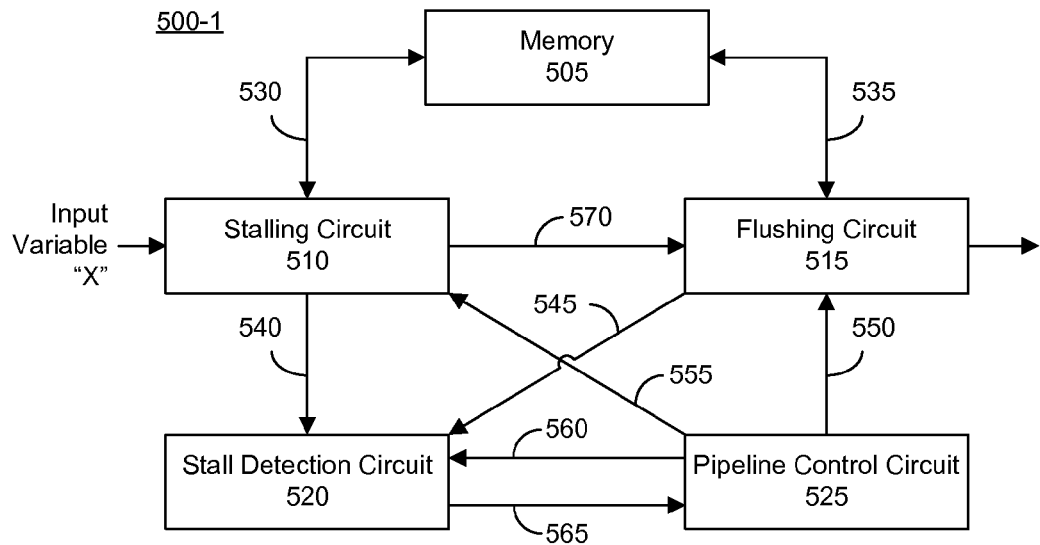
Figures 2, 5:
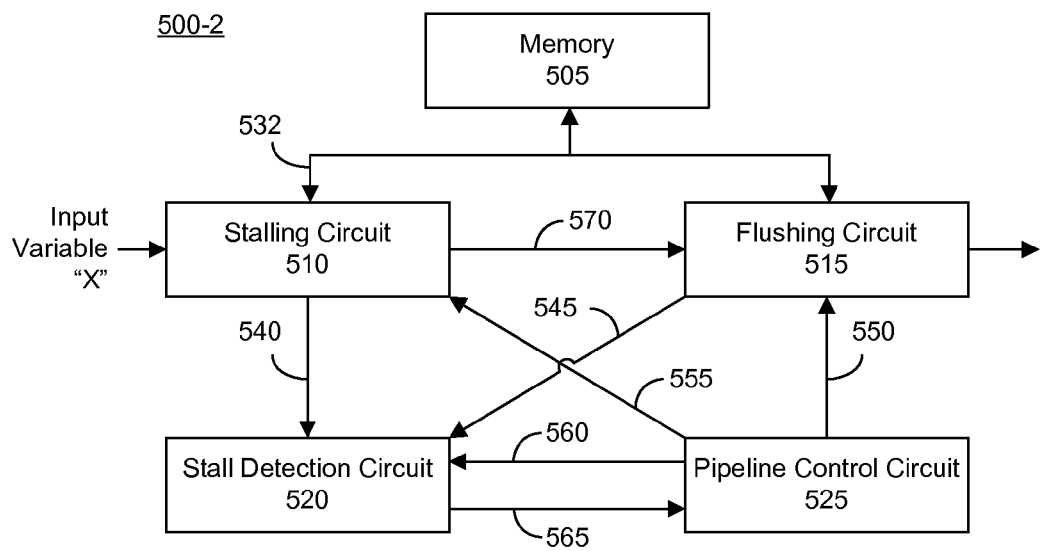

FIG. 5-1 is a block diagram illustrating exemplary circuitry 500-1 generated from HLPL description 300 of FIG. 3. As pictured, circuitry 500-1 includes a memory 505, a stalling circuit 510, a flushing circuit 515, a stall detection circuit 520, and a pipeline control circuit 525.

In one aspect, HLPL description 300 may be implemented as three pipeline stages. In functional terms, the first pipeline stage may read "A" at address "X." The second pipeline stage may add 1 to the value read from address "X." The third pipeline stage may write back to "A" at address "I." The pipeline stages for reading and writing A access a memory implementation of A.

Referring again to FIG. 5, memory 505 may be an implementation of the array "A" referenced in HLPL description 300. In the example shown, memory 505 is implemented as a two port memory depicted by the fact that stalling circuit 510 and flushing circuit 515 each may access memory 505 concurrently through different ports. One port, for example, is a read port. The other port is a write port.

Stalling circuit 510 includes the first pipeline stage implementing the circuitry that reads "A" at address "X." Stalling circuit 510 conducts read operations via read signal 530. Stalling circuit 510 is so named as block 510 is the circuitry that is stalled, or paused, responsive to a stall signal on pipeline control signals 555 from pipeline control circuitry 525. Flushing circuit 515 includes the second and third pipeline stages implementing the adder circuitry and the circuitry that writes the resulting value back to "A" at address "I," respectively. Flushing circuit 515 conducts write operations via write signal 535. Flushing circuit 515 is so named as block 515 is the circuitry that is permitted to continue to operate, thereby clearing, or flushing, data from the data path included therein while stalling circuit 510 is stalled.

Pipeline control circuit 525 includes circuitry implementing the loop control features of the control flow construct of HLPL description 300. For example, pipeline control circuitry 525 tracks and updates the value of "I" for each pipeline stage individually as that pipeline stage iterates. Pipeline control circuit 525 provides pipeline control signals 550 to flushing circuit 515 and pipeline control signals 555 to stalling circuit 515. Pipeline control signals 550 and 555 dictate starting and stopping for each loop iteration for each pipeline stage of stalling circuit 515 and flushing circuit 520 based upon the value of "I" or the value of "I" maintained for each respective pipeline stage as the case may be.

As pictured, stalling circuit 510 receives an input variable. In this example, stalling circuit 515 receives the value of "X" from another source external to circuit 500-1 and external to the loop control construct of HLPL 300. The value of "X" specifies an address of memory 505 that is to be accessed by stalling circuit 510. The memory access performed by stalling circuit 510 in this example is a read operation. In other exemplary circuit designs, however, the operation performed by the stalling circuitry may be a write. The term "memory access," as defined herein, means a read operation of a memory or a write operation to a memory.

In one aspect, stalling circuit 510 may send each received address for "X" to stall detection circuit 520 via address signal 540. The address provided to stall detection circuit 520 from stalling circuit 510 may be the entire address, less than the entire address such as a selected number of bits from predetermined bit positions of the address, or a single bit of the address from a particular bit location of the address.

Addresses that are processed by stalling circuit 510 and data obtained and/or generated by stalling circuit 510 may be provided to flushing circuit 520 through signal 570. Flushing circuit 515 may send each address that is to be used to perform a memory access, e.g., in this example a memory write access, to stall detection circuit 520 via address signal 545. Each address sent from flushing circuit 515 to stall detection circuit 520 may be an address that is currently being processed in flushing circuit 515, whether in the adder circuitry or the write circuitry, for which the write operation is not yet finished. For example, as an address is received from stalling circuit 510 over signal 570, flushing circuit 520 may provide the address to stall detection circuit 520 over signal 545.

Stall detection circuit 520 further may receive information such as values of control variables from pipeline control circuit 525 through signal 560. The values of control variables, for example, the value of "I," may be updated and provided to stall detection circuit 520 for each iteration of the "for loop" for the write circuitry. Stall detection circuit 520 detects a memory access conflict using information obtained from stalling circuit 510, information obtained from flushing circuit 515, and/or information obtained from pipeline control circuit 525.

Responsive to detecting a memory access conflict, stall detection circuit 520 asserts conflict signal 565 to pipeline control circuit 525. Responsive to assertion of conflict signal 565, pipeline control circuit 525 asserts a stall signal to stalling circuit 510 over pipeline control signals 555. The stall signal represents an instruction for stalling circuit 510 to stall, e.g., pause or temporarily halt operation for a predetermined number of clock cycles.

FIG. 5-2 is a block diagram illustrating different exemplary circuitry 500-2 generated from HLPL description 300 of FIG. 3. Circuitry 500-2 is an alternative implementation than that of FIG. 5-1. Circuitry 500-2 is substantially similar to circuitry 500-1 with the exception that memory 505 may be implemented as a single port memory. As shown, memory 505 is coupled to stalling circuitry 510 and flushing circuitry 515 via a single port illustrated as signal 532.

In one aspect, circuitry 500-2 may utilize dynamic arbitration to regulate read by stalling circuit 510 and/or write access by flushing circuit 515 to memory 505. In another example, reads and writes may alternate on the same port, which is also referred to as "initiation interval 2." In still another aspect, optimization of HLPL description 300 may result in only one port for memory 505 being necessary. For example, since A[X] is typically reading the same value, continued reading of the value is redundant and may waste usage of the memory port. Instead, A[X] may be read one time before loop processing starts. In that case, in execution of the pipeline, only one port is needed to write the new value to A[I].

Figure 6:
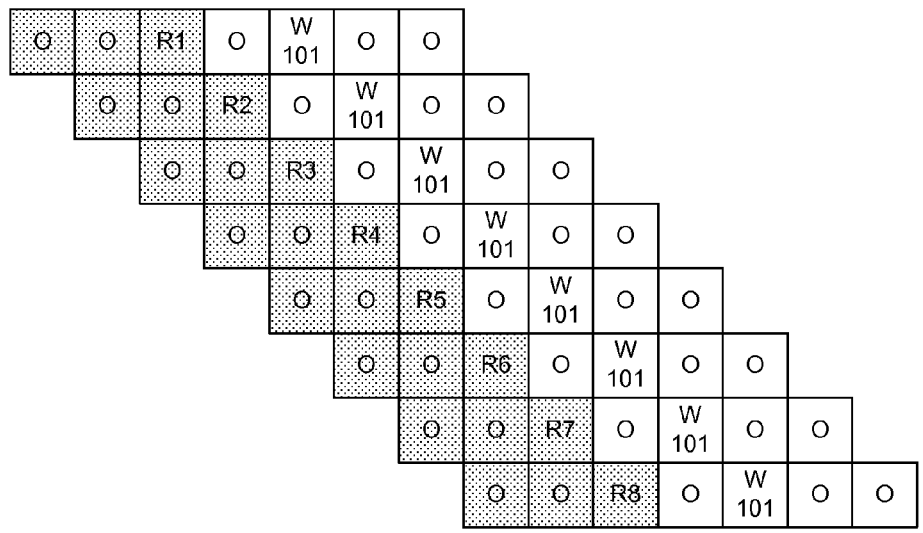
FIG. 6 is a block diagram illustrating memory accesses without a memory access conflict.

FIG. 6 is a block diagram illustrating a plurality of memory accesses 600 without a memory access conflict. FIG. 6 illustrates memory accesses for a pipelined circuit design that does not require stalling. Each row represents an iteration of the loop body of a flow control construct converted into a circuit design. In the example of FIG. 6, each clock cycle is represented by a square. Clock cycles for operations performed by a first pipeline stage are shaded, while clock cycles for operations performed by one or more subsequent stages referred to herein as a second pipeline stage are not shaded. Read operations are represented by the letter "R" followed by a numerical value specifying the address in memory that is read. Write operations are represented by the letter "W" followed by a numerical value specifying the address in memory that is written.

The first pipeline stage performs a read from address 1 during the first iteration, a read from address 2 during a second iteration, etc. The second pipeline stage performs a write operation to address 101 in each iteration. No memory access conflict occurs in the example of FIG. 6. While FIG. 6 illustrates a scenario that may be similar to that of FIG. 3, FIG. 6 is provided for purposes of illustration only and is not intended to be a literal representation of operations performed by a circuit design derived from HLPL 300 of FIG. 3.

Figure 7:
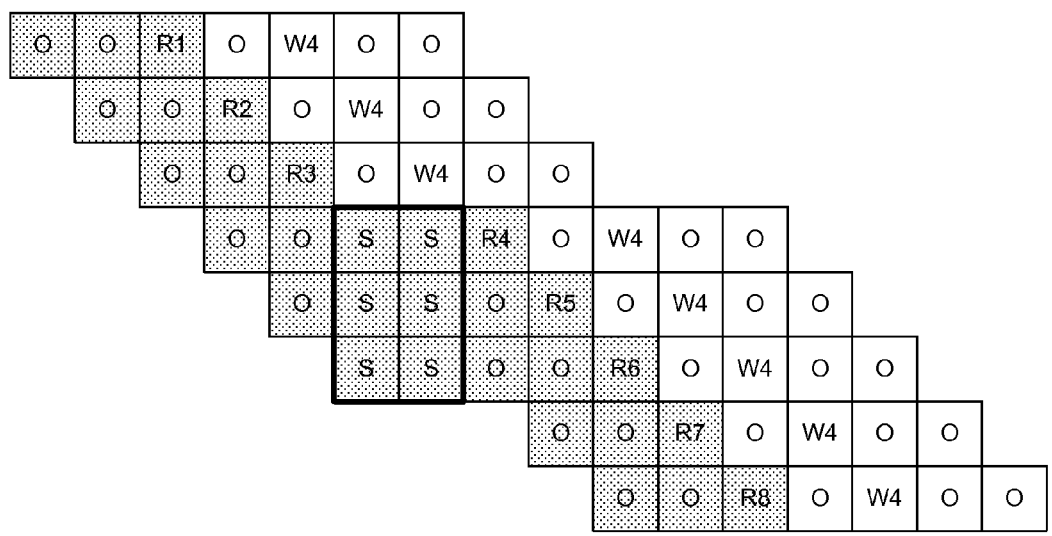
FIG. 7 is a block diagram illustrating memory accesses with a memory access conflict.

FIG. 7 is a block diagram illustrating a plurality of memory accesses 700 with a memory access conflict. FIG. 7 illustrates memory accesses for a pipelined circuit design that does require stalling. The first pipeline stage performs a read from address 1 during the first iteration, a read from address 2 during a second iteration, etc. The second pipeline stage performs a write operation to address 4 in each iteration. During the $5^{th}$ iteration, if the circuit design is not stalled, a read of address 4 occurs prior to address 4 being written by the second pipeline stage for a prior iteration. This condition is a data dependent conflict as the operations, if no stalling is performed, are performed in a sequence that may not have the same behavior as the sequence specified in the original HLPL description. In order to prevent the memory access conflict, the first pipeline stage is stalled for two clock cycles, thereby delaying the read of address 4 until after the second stage completes the write to address 4 for the prior iteration, i.e., iteration 4.

It should be appreciated that when detecting a memory access conflict or the occurrence of a memory access conflict, the inventive arrangements described within this disclosure detect a potential occurrence of a memory access conflict. The potential occurrence is detected prior to an actual memory access conflict, or error, taking place. As such, the memory access conflict is avoided using the inventive arrangements disclosed herein. For ease of description and clarity, the phrases "memory access conflict" and/or "occurrence of a memory access conflict" are used to refer to the potential or expectation that a memory access conflict will occur. The detection and subsequent stalling avoids the actual occurrence of a memory access conflict.

Figure 8:
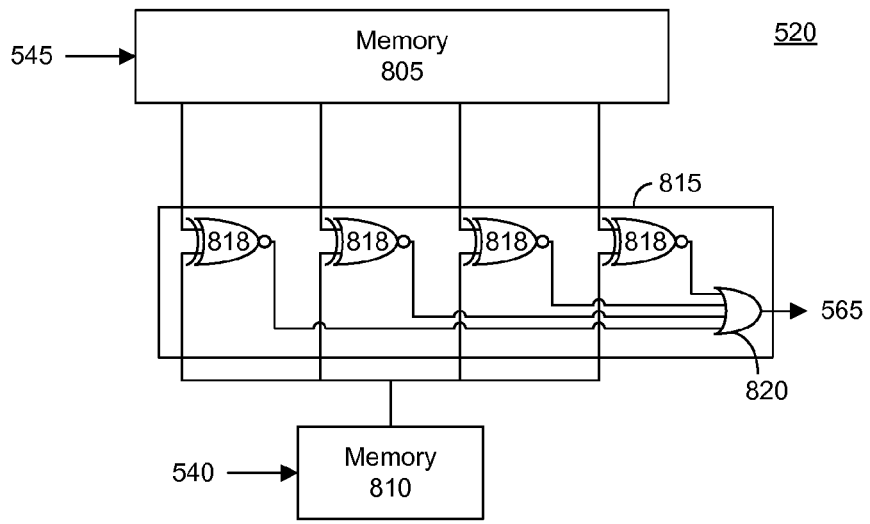
FIG. 8 is a block diagram illustrating an exemplary stall detection circuit.

FIG. 8 is a block diagram illustrating an exemplary implementation of stall detection circuit 520. As pictured, stall detection circuit 520 includes a memory 805, a memory 810, and a comparison circuit 815.

Memory 805 receives addresses of uncompleted memory accesses from flushing circuit 515 through address signal 545. In one aspect, memory 805 is implemented as a shift register. The size of memory 805 depends upon the depth of the pipelining in flushing circuit 515. For example, memory 805 may be sized so that each address of an uncompleted memory access, e.g., a memory write in this example, may be stored. Further, as each memory access is completed by flushing circuit 515, or more particularly, by the write circuitry within flushing circuit 515, the address used for the memory access exits memory 805. For example, the address of a completed memory access is shifted out of memory 805, overwritten with a new address for an uncompleted memory access, or otherwise deleted.

Memory 810 receives addresses from stalling circuit 505 through address signal 540. Memory 810 may be sized to store the address of a memory access that is to be performed next. Referring to the example of FIGS. 3 and 5, memory 810 may store the address of the next read to be performed by stalling circuit 805.

Comparison circuit 815 may include a plurality of comparators 818, e.g., XNOR gates in this example, that compare each address stored in memory 805 with the address stored in memory 810. Responsive to any one of the comparators within comparison circuit 815 detecting a matching address, the comparator asserts a signal that causes a further comparator 820, e.g., an OR gate, to generate or assert conflict signal 565.

In one aspect, stall detection circuit 520 may be implemented so that entire addresses are compared. For example, comparators 818 within comparison circuit 815 may be sized to compare each bit of the addresses in memory 805 with each corresponding bit of the address stored in memory 805. In another aspect, fewer than all bits may be compared. For example, the most significant N-bits may be compared where N is an integer value that is less than the bit-width of the addresses.

It should be appreciated that comparing each bit of the addresses results in a highly accurate mechanism that detects conflicts. Stall detection circuit 520 triggers a stall of stalling circuit 505 responsive to an address of a next memory access of stalling circuit 510 matching any address of an uncompleted memory access from flushing circuit 515, or at least the portion of flushing circuit 515 that performs a memory access. An implementation where all bits are compared requires additional circuitry and IC resources.

In the case where fewer than all bits are compared, stall detection circuit 520 may assert conflict signal 565 in cases where no memory access conflict exists. The accuracy of stall detection circuit 520 will depend upon the number of bits that are compared. It should be appreciated, however, that when stall detection circuit 520 compares fewer than all bits of the addresses, less circuitry and IC resources are required for implementation as compared to an implementation where all bits of the addresses are compared to determine an exact match. Further, due to decreased accuracy from using fewer than all address bits for comparison, a memory access conflict may be detected in some cases where no memory access conflict occurs.

Figure 9:
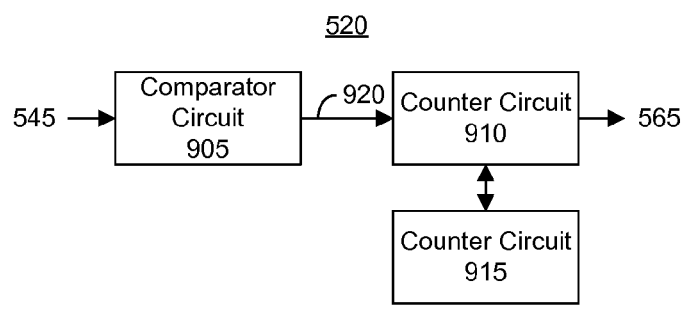
FIG. 9 is a block diagram illustrating another exemplary stall detection circuit.

FIG. 9 is a block diagram illustrating another exemplary implementation of stall detection circuit 520. As pictured in FIG. 9, stall detection circuit 520 includes a comparator circuit 905, a counter 910, and a counter 915. Comparator circuit 905 receives address signal 545 as input. In one aspect, comparator circuit 905 is coupled to determine whether each received address meets a predefined criteria. For example, comparator circuit 905 is coupled to determine whether one or more predefined bit locations of each received address are set. The particular bits specified in the predefined criteria may be bits, or a subset of bits, that are known to be set for a loop invariant variable, e.g., variable "X" in reference to FIG. 3. If the predefined criteria is met for a received address, comparator circuit 905 signals counter circuit 910 to increment via signal 920.

Counter circuit 915 may be coupled to signal counter circuit 910 to decrement after a particular number of clock cycles. For example, an address detected on address signal 545 may require "N" clock cycles to exit flushing circuitry 515 or exit the write circuitry of flushing circuitry 515. In this example, "N" is an integer value. Counter circuit 915 may count to "N" and rollover or reset to begin counting again. Upon reaching a count of "N," counter circuit 915 signals counter circuit 910 to decrement the count stored therein.

Counter circuit 910 outputs or asserts conflict signal 565 while a non-zero counter value is stored within counter circuit 910. A non-zero counter value indicates that at least one address of an uncompleted memory access of flushing circuit 515 exists that may conflict with an address for a memory access to be performed by stalling circuit 510, e.g., the loop invariant variable.

Figure 10:
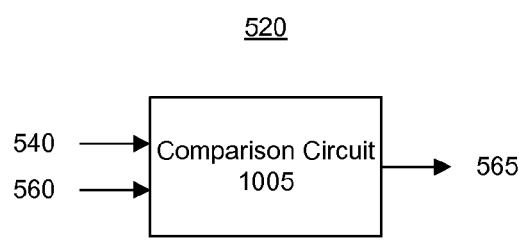
FIG. 10 is a block diagram illustrating another exemplary stall detection circuit.

FIG. 10 is a block diagram illustrating another exemplary implementation of stall detection circuit 520. FIG. 10 illustrates a scenario where the EDA tool determines a stall prediction expression that depends upon the loop control variable(s) and/or the input variable(s). The stall prediction expression is implemented as a circuit design specifying a comparison circuit 1005. Comparison circuit 1005 receives any input variables provided to stalling circuit 510 through signal 540. Values of control variables are provided to comparison circuit 1005 through signal 560. Comparison circuit 1005 calculates the stall prediction expression involving the value(s) for the control variable(s) and/or the input variable (s). If, for example, the stall prediction expression evaluates to true, comparison circuit 1005 outputs or asserts conflict signal 565.

As an illustrative example, comparison circuit 1005 may include XNOR circuitry that compares the value of "X" with the value of "I" for each iteration thereby evaluating the stall prediction expression of "X=I." Responsive to determining that the stall prediction expression is true, comparison circuit 1005 asserts conflict signal 565. The XNOR circuitry outputs a logic 1 responsive to determining that the value of "X" matches the value of "I."

Referring to FIGS. 8-10, the various circuit blocks included within stall detection circuit 520 may be referred to collectively as "stall circuitry" within this specification from time to time.

FIG. 11 is a flow chart illustrating an exemplary method 1100 of high level synthesis. Method 1100 may be performed by system 100 described with reference to FIG. 1. Method 1100 may begin in a state where an HLPL description is stored within the system and available for processing.

In block 1105, the system determines a data dependency for a flow control construct of the HLPL description. In block 1110, the system optionally performs additional operations pictured as blocks 1115 and 1120. Block 1110 illustrates an aspect in which the system automatically selects which of a plurality of different possible stall detection circuits are to be implemented.

In block 1115, for example, the system optionally estimates costs for different stall detection circuit implementations. A cost may be estimated, for example, for each of the various stall circuit implementations, or stall circuitry, described with reference to FIGS. 8, 9, and 10.

In one aspect, cost may be estimated by determining the likely number of IC resources, e.g., lookup-tables, memories, size of the resources needed, and the like that will be required to implement the stall detection circuit. For example, the complexity of the stall prediction expression, the number of address for uncompleted memory accesses that must be stored, the bitwidth of addresses, and the like may be used in determining the amount of IC resources needed, e.g., memory size and the like. The more resources required, the higher the cost. In another aspect, the cost may be estimated using the area of the IC required to implement the stall detection circuit. The larger the area required, the higher the cost. In another aspect, the accuracy of the stall detection circuit may be considered where higher accuracy translates to lower cost.

While any of the aforementioned measures may be used for cost, in another aspect, a combination of one or more or all of such measures may be used to estimate cost. For example, each of the aforementioned measures may be associated with a weighting factor between 0 and 1. The product of the weighting factor and each associated measure may be summed to estimate the cost. For example, cost may be estimated as cost=a(amount of IC resources)+b(required IC area)+c(accuracy), where a, b, and c are weighting factors between 0 and 1 that are set according to user preference. Additionally, the system may consider constraints on the cost or performance to eliminate implementation alternatives that are unlikely to meet system-level resource or performance constraints.

In block 1120, the system optionally selects a stall detection circuit implementation according to the estimated cost. In one aspect, the system selects the stall detection circuit with the lowest estimated cost. It should be appreciated that in the event that block 1110 is not performed, a particular stall detection circuit implementation may be selected through user input. For example, the user may choose a particular stall detection circuit implementation through the system prior to implementation of method 1100.

In block 1125, the system translates the HLPL description into a circuit design specifying circuitry for implementation within an IC. As discussed, the circuit design may be specified in RTL form using an HDL, as a netlist, or the like. Translation or compilation techniques for translating an HLPL description into a circuit design are known to the skilled artisan. In translating the HLPL description, the resulting circuit design is pipelined. In one aspect, the circuit design is pipelined aggressively in that pipelining is added as if no memory access conflicts exist.

In block 1130, the system generates the stall detection circuit as part of the circuit design. For example, the system generates HDL specifying the selected stall detection circuitry and includes the generated HDL within the circuit design. The system may generate the stall detection circuit pre-selected by the user or generate the stall detection circuit selected in block 1120 if performed.

In one aspect, blocks 1125 and 1130 may be part of a back-end phase of compiler operation for the system. In block 1125, for example, the intermediate representation may be further translated into HDL. In block 1130, HDL may be generated specifying the selected stall detection circuit.

FIG. 12 is a flow chart illustrating an exemplary implementation of block 1105 of FIG. 11. FIG. 12 presents a more detailed example of the operations that may be performed by the system in implementing block 1105.

In block 1205, the system performs a front-end compiler phase on the HLPL description. Performing a front-end compiler phase may include any of a variety of operations. For example, the system may perform operations including, but not limited to, loop unrolling, bitwidth minimization, code motions where portions of code such as loop invariant code is moved outside of the loop body to avoid duplication in circuitry, and the like. Other exemplary operations that may be performed during the front-end compiler phase may include, but are not limited to, lexical analysis, semantic analysis or parsing, pre-processing, optimization, and/or the like. Front-end analysis typically results in the creation of an intermediate or internal representation of the HLPL representation. The intermediate representation is language independent and, as such, "generic."

In block 1210, the system performs static analysis. The system may analyze the dependency information generated during the front-end compiler phase and the intermediate representation that is generated. In block 1215, the system may optionally shift the occurrence, or occurrences as the case may be, of one or more memory access conflicts. The system may reorder loop iterations of the flow control construct so that occurrences of memory access conflicts are grouped together in consecutive iterations. Memory access conflicts further may be grouped together and shifted to the beginning of the loop iterations, to the end of the loop iterations, placed in the middle of the loop iterations, or placed in a selected range of the loop iterations. For example, a designer may determine that generating as many outputs as possible as early as possible is preferable since a downstream circuit block is able to consume the output that is generated. In that case, the designer may select a preference in the system that causes the system to reorder loop iterations so that stalls are moved to the end of execution. In another example, the designer may determine that generating fewer outputs initially is preferable since a downstream circuit block is not able to consume the output that is generated. In that case, the designer may select a preference in the system that causes the system to reorder loop iterations so that stalls are moved to the beginning of execution.

In block 1220, the system stores dependency information and/or generates a stall prediction expression. In illustration, for control flow constructs that are accurately analyzed, the system may store the dependency information in memory for subsequent use. The dependency information may be used for purposes of cost estimation and generation of the stall detection circuitry. In one aspect, the system may also generate a stall prediction expression. The system, however, need not generate the stall prediction expression in the case where the control flow construct is accurately analyzed. An example where the control flow construct is accurately analyzed is where a static analysis shows that memory access conflicts do not occur for a target pipeline initiation interval.

For control flow constructs where the system is unable to accurately determine dependency information, the system generates a stall prediction expression. In that case, the system may also generate additional data such as the maximum number of live array accesses and provides the stall prediction expression and any additional data to a cost evaluation module. As described with reference to FIG. 11, the system may evaluate the implementation choices for the stall detection circuit. After implementation of block 1220, the system may continue to block 1110 of method 1100.

In accordance with the inventive arrangements disclosed herein, an HLPL description may be processed and aggressively pipelined. Data dependent memory access conflicts may be detected through analysis of the HLPL description during HLS. The data dependencies recognized for flow control constructs are used to generate a hardware description of stall detection circuitry. The stall detection circuitry handles the memory access conflicts that may arise thereby allowing the HLPL description to be highly pipelined. In one aspect, a plurality of different stall detection circuits may be considered based upon an estimated cost of implementation for each. The system may select the least costly implementation and generate the circuit design to include the selected implementation of the stall detection circuit.

For purposes of explanation, specific nomenclature is set forth to provide a thorough understanding of the various inventive concepts disclosed herein. The terminology used herein, however, is for the purpose of describing particular aspects of the inventive arrangements only and is not intended to be limiting.

The terms "a" and "an," as used herein, are defined as one or more than one. The term "plurality," as used herein, is defined as two or more than two. The term "another," as used herein, is defined as at least a second or more. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

As defined herein, the term "automatically" means without user intervention. As defined herein, the term "user" means a human being. The term "and/or" as used herein refers to and encompasses any and all possible combinations of one or more of the associated listed items. It will be further understood that the terms "includes" and/or "including," when used in this disclosure, specify the presence of stated features, integers, steps, operations, elements, and/or components, but do not preclude the presence or addition of one or more other features, integers, steps, operations, elements, components, and/or groups thereof. It will also be understood that, although the terms first, second, etc. may be used herein to describe various elements, these elements should not be limited by these terms, as these terms are only used to distinguish one element from another.

The term "if" may be construed to mean "when," "upon," "in response to determining," "in response to detecting," "responsive to determining," or "responsive to detecting," depending on the context. Similarly, the phrase "if it is determined" or the phrase "if [a stated condition or event] is detected" may be construed to mean "upon determining," "in response to determining," "responsive to determining," "upon detecting [the stated condition or event]," "in response to detecting [the stated condition or event]," or "responsive to detecting [the stated condition or event]," depending on the context.

Within this disclosure, the same reference characters are used to refer to terminals, signal lines, wires, and their corresponding signals. In this regard, the terms "signal," "wire," "connection," "terminal," and "pin" may be used interchangeably, from time-to-time, within this disclosure. It also should be appreciated that the terms "signal," "wire," or the like can represent one or more signals, e.g., the conveyance of a single bit through a single wire or the conveyance of multiple parallel bits through multiple parallel wires. Further, each wire or signal may represent bi-directional communication between two, or more, components connected by a signal or wire as the case may be.

One or more aspects described within this disclosure can be realized in hardware or a combination of hardware and software. One or more aspects can be realized in a centralized fashion in one system or in a distributed fashion where different elements are spread across several interconnected systems. Any kind of data processing system or other apparatus adapted for carrying out at least a portion of the methods described herein is suited.

One or more aspects further can be embedded in a computer program product, which includes all the features enabling the implementation of the methods described herein. The computer program product includes a computer-readable data storage medium. As defined herein, the term "computer-readable storage medium" means a storage medium that contains or stores program code for use by or in connection with an instruction execution system, apparatus, or device. As defined herein, a "computer-readable storage medium" is non-transitory and, as such, is not a transitory propagating signal per se. Examples of a computer-readable storage medium may include, but are not limited to, optical media, magnetic media, magneto-optical media, computer memory such as random access memory, a bulk storage device, e.g., hard disk, or the like.

The flowchart and block diagrams in the Figures illustrate the architecture, functionality, and operation of possible implementations of systems, methods and computer program products according to various aspects of the inventive arrangements disclosed herein. In this regard, each block in the flowchart or block diagrams may represent a module, segment, or portion of code, which includes one or more executable instructions for implementing the specified logical function(s). It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In one aspect, the blocks in the flow chart illustration may be performed in increasing numeric order corresponding to the numerals in the various blocks. In other aspects, the blocks may be performed in an order that is different, or that varies, from the numerals in the blocks. For example, two or more blocks shown in succession may be executed substantially concurrently. In other cases, two or more blocks may sometimes be executed in the reverse order, depending upon the functionality involved. In still other cases, one or more blocks may be performed in varying order with the results being stored and utilized in subsequent or other blocks that do not immediately follow.

The terms "computer program," "software," "application," "computer-usable program code," "program code," "executable code," variants and/or combinations thereof, in the present context, mean any expression, in any language, code or notation, of a set of instructions intended to cause a data processing system to perform a particular function either directly or after either or both of the following: a) conversion to another language, code, or notation; b) reproduction in a different material form. For example, program code can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

Thus, throughout this disclosure, statements utilizing terms such as "processing" or "computing" or "calculating" or "determining" or "displaying" or the like, refer to the action and processes of a data processing system, e.g., a computer system, or similar electronic computing device, that manipulates and transforms data represented as physical (electronic) quantities within the computer system's registers and/or memories into other data similarly represented as physical quantities within the computer system memories and/or registers or other such information storage, transmission or display devices.

The corresponding structures, materials, acts, and equivalents of all means or step plus function elements in the claims below are intended to include any structure, material, or act for performing the function in combination with other claimed elements as specifically claimed.

A method includes determining a data dependency for a flow control construct of an HLPL description and translating the HLPL description into a circuit design specifying circuitry for implementation within an IC. The circuitry is pipelined. The method includes generating, as part of the circuit design and using a processor, a stall detection circuit coupled to selectively initiate a stall of a stalling portion of the circuitry according to the data dependency.

Generating the stall detection circuit may include generating stall circuitry coupled to determine whether at least a portion of a write address for the flow control construct matches at least a portion of a read address for the flow control construct during an iteration. The stall circuitry generates a conflict signal responsive to determining a match. In one aspect, the stall circuitry compares the entire write address with the entire read address.

In another aspect, generating the stall detection circuit may include generating stall circuitry coupled to maintain a count of detected addresses of uncompleted memory accesses within a flushing portion of the circuitry that have a predetermined value in at least one bit location of the address. The stall circuitry generates a conflict signal while the count is non-zero.

In still another aspect, the flow control construct may include a loop. In that case, generating the stall detection circuit may include generating stall circuitry coupled to detect the data dependency according to an expression that depends upon a value of a loop counter of the loop and a value of an input variable to a body of the loop. The stall circuitry generates a conflict signal responsive to detecting the data dependency. The expression may indicate a particular loop iteration where a memory access conflict occurs.

In a further aspect, the flow control construct may be a loop. In that case, the method may include shifting an occurrence of at least one memory access conflict by reordering loop iterations.

A system includes a first memory, a stalling circuit coupled to the first memory, a flushing circuit coupled to the first memory, and a stall detection circuit coupled to detect a memory access conflict between the stalling circuit and the flushing circuit according to a data dependency. The system also includes a pipeline control circuit coupled to stall the stall circuit responsive to detection of the memory access conflict by the stall detection circuit.

The stall detection circuit may include a second memory coupled to store an address for an access of the first memory by the stalling circuit, a third memory coupled to store addresses of uncompleted accesses of the first memory by the flushing circuit, and a comparison circuit coupled to determine whether the address in the second memory matches addresses stored in the third memory.

In one example, the comparison circuit is coupled to generate a conflict signal to the pipeline control circuit responsive to determining a match. In another example, the comparison circuit is coupled to compare the full address stored in the second memory with the full addresses stored in the third memory. In still another example, the comparison circuit is coupled to compare one or more bits of the address stored in the second memory with the same one or more bits (e.g., bit locations) of the addresses stored in the third memory.

The third memory may be implemented as a shift register. In that case, the addresses of uncompleted memory accesses are shifted through the shift register and the comparison circuit is coupled to generate a conflict signal to the pipeline control circuit while at least one address stored in the shift register matches the address of the second memory.

In another aspect, the stall detection circuit may include a comparison circuit coupled to detect addresses of uncompleted memory accesses of the first memory by the flushing circuit that have a predetermined bit value in at least one predetermined bit location of the address, and counter circuitry coupled to maintain a count of addresses of uncompleted memory accesses detected by the comparison circuit within the flushing circuit. The counter circuitry is coupled to generate a conflict signal while the count is non-zero.

In still another aspect, the stall detection circuit includes a comparison circuit coupled to detect the memory access conflict according to an expression that depends upon a value of a loop from the pipeline control circuit and a value of an input to the stalling circuit. The comparison circuit is coupled to generate a conflict signal responsive to detecting the memory access conflict. For example, the comparison circuit may be coupled to determine a particular iteration of the loop where the memory access conflict occurs.

A stall detection circuit includes a first memory coupled to receive an address for a memory access of a stalling portion of a circuit, a second memory coupled to store addresses of uncompleted memory accesses received from a flushing portion of the circuit, and a comparison circuit coupled to determine whether the address in the first memory matches addresses stored in the second memory. Responsive to determining a match, the comparison circuit is coupled to generate a conflict signal to a pipeline control circuit coupled to control stalling of the stalling portion of the circuit.

In one aspect, the comparison circuit compares the full address stored in the first memory with the full addresses stored in the second memory. In another aspect, the comparison circuit compares less than the full address stored in the first memory with less than the full addresses stored in the second memory.

The features described within this disclosure can be embodied in other forms without departing from the spirit or essential attributes thereof. Accordingly, reference should be made to the following claims, rather than to the foregoing disclosure, as indicating the scope of such features and implementations.

What is claimed is:
1. A method, comprising:
 determining a data dependency for a flow control construct of a high level programming language description;
 translating the high level programming language description into a circuit design specifying circuitry for implementation within an integrated circuit;
 wherein the circuitry is pipelined;

generating, as part of the circuit design and using a processor, a stall detection circuit coupled to selectively initiate a stall of a stalling portion of the circuitry according to the data dependency;
wherein generating the stall detection circuit comprises generating stall circuitry coupled to determine whether at least a portion of a write address for the flow control construct matches at least a portion of a read address for the flow control construct during an iteration; and
the stall circuitry generates a conflict signal responsive to determining a match.

2. The method of claim 1, wherein the stall circuitry compares the entire write address with the entire read address.

3. The method of claim 1, wherein:
generating the stall detection circuit comprises generating stall circuitry coupled to maintain a count of detected addresses of uncompleted memory accesses within a flushing portion of the circuitry that have a predetermined value in at least one bit location of the address; and
the stall circuitry generates a conflict signal while the count is non-zero.

4. The method of claim 1, wherein:
the flow control construct comprises a loop;
generating the stall detection circuit comprises generating stall circuitry coupled to detect the data dependency according to an expression that depends upon a value of a loop counter of the loop and a value of an input variable to a body of the loop; and
the stall circuitry generates a conflict signal responsive to detecting the data dependency.

5. The method of claim 4, wherein the expression indicates a particular loop iteration where a memory access conflict occurs.

6. The method of claim 1, wherein:
the flow control construct comprises a loop; and
the method further comprises shifting an occurrence of at least one memory access conflict by reordering loop iterations.

7. A system, comprising:
a first memory;
a stalling circuit coupled to the first memory;
a flushing circuit coupled to the first memory;
a stall detection circuit coupled to detect a memory access conflict between the stalling circuit and the flushing circuit according to a data dependency; and
a pipeline control circuit coupled to stall the stall circuit responsive to detection of the memory access conflict by the stall detection circuit.

8. The system of claim 7, wherein the stall detection circuit comprises:
a second memory coupled to store an address for an access of the first memory by the stalling circuit;
a third memory coupled to store addresses of uncompleted accesses of the first memory by the flushing circuit; and
a comparison circuit coupled to determine whether the address in the second memory matches addresses stored in the third memory.

9. The system of claim 8, wherein the comparison circuit is coupled to generate a conflict signal to the pipeline control circuit responsive to determining a match.

10. The system of claim 8, wherein the comparison circuit is coupled to compare the full address stored in the second memory with the full addresses stored in the third memory.

11. The system of claim 8, wherein the comparison circuit is coupled to compare at least one bit of the address stored in the second memory with a same at least one bit of the addresses stored in the third memory.

12. The system of claim 8, wherein the third memory comprises a shift register.

13. The system of claim 12, wherein:
the addresses of uncompleted memory accesses are shifted through the shift register; and
the comparison circuit is coupled to generate a conflict signal to the pipeline control circuit while at least one address stored in the shift register matches the address of the second memory.

14. The system of claim 7, wherein the stall detection circuit comprises:
a comparison circuit coupled to detect addresses of uncompleted memory accesses of the first memory by the flushing circuit that have a predetermined bit value in at least one predetermined bit location of the address; and
counter circuitry and coupled to maintain a count of addresses of uncompleted memory accesses detected by the comparison circuit within the flushing circuit;
wherein the counter circuitry and is coupled to generate a conflict signal while the count is non-zero.

15. The system of claim 7, wherein:
the stall detection circuit comprises a comparison circuit coupled to detect the memory access conflict according to an expression that depends upon a value of a loop from the pipeline control circuit and a value of an input to the stalling circuit; and
the comparison circuit is coupled to generate a conflict signal responsive to detecting the memory access conflict.

16. The system of claim 15, wherein the comparison circuit is coupled to determine a particular iteration of the loop where the memory access conflict occurs.

17. A stall detection circuit, comprising:
a first memory coupled to receive an address for a memory access of a stalling portion of a circuit;
a second memory coupled to store addresses of uncompleted memory accesses received from a flushing portion of the circuit; and
a comparison circuit coupled to determine whether the address in the first memory matches addresses stored in the second memory;
wherein responsive to determining a match, the comparison circuit is coupled to generate a conflict signal to a pipeline control circuit coupled to control stalling of the stalling portion of the circuit.

18. The stall detection circuit of claim 17, wherein the comparison circuit is coupled to compare the full address stored in the first memory with the full addresses stored in the second memory.

19. The stall detection circuit of claim 17, wherein the comparison circuit is coupled to compare less than the full address stored in the first memory with less than the full addresses stored in the second memory.

* * * * *